United States Patent
Kumar et al.

(10) Patent No.: US 10,302,695 B2
(45) Date of Patent: May 28, 2019

(54) LOW AREA PARALLEL CHECKER FOR MULTIPLE TEST PATTERNS

(71) Applicant: STMICROELECTRONICS INTERNATIONAL N.V., Schiphol (NL)

(72) Inventors: Tejinder Kumar, Moga (IN); Akshat Jain, Nahan (IN)

(73) Assignee: STMICROELECTRONICS INTERNATIONAL N.V., Schiphol (NL)

( * ) Notice: Subject to any disclaimer, the term of this patent is extended or adjusted under 35 U.S.C. 154(b) by 0 days.

(21) Appl. No.: 15/797,504

(22) Filed: Oct. 30, 2017

(65) Prior Publication Data

US 2019/0128960 A1 May 2, 2019

(51) Int. Cl.
*G01R 31/317* (2006.01)
*G01R 31/3177* (2006.01)

(52) U.S. Cl.
CPC ... *G01R 31/31703* (2013.01); *G01R 31/3177* (2013.01)

(58) Field of Classification Search
CPC .......... G01R 31/31703; G01R 31/3177; G01R 31/3193
See application file for complete search history.

(56) References Cited

U.S. PATENT DOCUMENTS

| | | | | |
|---|---|---|---|---|
| 5,563,833 A * | 10/1996 | Adams | ................ | G06F 12/0893 365/201 |
| 6,058,452 A * | 5/2000 | Rangasayee | ............ | G11C 11/41 365/49.15 |
| 6,496,950 B1 * | 12/2002 | Zhao | ..................... | G11C 15/00 714/718 |
| 6,804,744 B1 * | 10/2004 | Abbas | .................... | G11C 15/00 365/49.15 |
| 6,982,891 B2 * | 1/2006 | Monzel, III | ........... | G11C 15/04 365/189.08 |
| 7,193,877 B1 * | 3/2007 | Yelluru | ................... | G11C 15/00 365/201 |
| 7,219,113 B2 | 5/2007 | Bonaccio et al. | | |
| 9,697,910 B1 * | 7/2017 | Huott | .................... | G11C 29/02 |
| 2005/0166102 A1 * | 7/2005 | Damon | .................. | G11C 29/38 714/718 |

(Continued)

*Primary Examiner* — Cynthia Britt
(74) *Attorney, Agent, or Firm* — Seed IP Law Group LLP

(57) ABSTRACT

Various embodiments provide a parallel checker to determine whether a device under test (DUT) is functioning properly or outputting erroneous bits. A test pattern or test data is injected into the DUT, and the parallel checker compares output data of the DUT to expected data stored in the parallel checker. The parallel checker determines an error in the event that a bit in the output data does not match in the expected data. The parallel checker is independent of test pattern length and data width at the parallel input of the parallel checker. Accordingly, the parallel checker may be used for multiple different test patterns, such as a PRBS 7, a CJTPAT, CRPAT, etc. Further, the parallel checker provides high-speed synchronization between data received from the DUT and expected test data stored in the parallel checker. In addition, the parallel checker consumes relatively low power and chip area in, for example, a SoC environment.

18 Claims, 4 Drawing Sheets

(56) References Cited

U.S. PATENT DOCUMENTS

2010/0103712 A1* 4/2010 Irby .................. G11C 15/00
                                                  365/49.17
2011/0310685 A1* 12/2011 Song ................. G11C 5/00
                                                  365/201

* cited by examiner

LOW AREA PARALLEL CHECKER FOR MULTIPLE TEST PATTERNS

BACKGROUND

Technical Field

The present disclosure is directed to a parallel checker for testing devices, such as high-speed serial receivers. The parallel checker is data width independent and has a low chip area.

Description of the Related Art

Communication devices, such as a high-speed serial receiver, a high-speed serial optical interface, and a hard disk device interface, typically undergo testing to ensure that they are functioning properly. For example, a device under test (DUT) may be inspected using bit error rate (BER) testing by injecting a test pattern into the DUT, and then checking the output data of the DUT using a pattern checker. The pattern checker compares the output data of the DUT with expected data to determine a number of erroneous bits.

There are generally two types of pattern checkers: serial checkers and parallel checkers. Serial checkers compare output data of a DUT with expected data serially, and parallel checkers compare output data of a DUT with expected data in parallel. Serial checkers typically have very high power consumption at higher data rates, which is undesirable for applications in which power is limited. Consequently, parallel checkers are often preferred over serial checkers.

Current parallel checkers, however, have many drawbacks. For example, current parallel checkers are data width dependent. That is, current parallel checkers are often configured to accept test patterns having a fixed data width (i.e., number of bits) at their input, and cannot be used with multiple different test patterns having different data widths. This is problematic, as most current checkers are adapted to use a pseudo-random binary sequence (PRBS) as a test pattern, but some high-speed serial standards desire different test patterns other than PRBS, such as a compliant jitter tolerance pattern (CJTPAT), a continuous random test pattern (CRPAT), etc.

Consequently, current parallel checkers are also not well suited for a system on chip (SoC) environment. In a SoC environment, devices may malfunction due to problems, such as clock sharing, power supply sharing, cross talk, etc. As such, it is important to test each of the devices in the SoC environment. However, as each device has their own specifications, each of the devices should have a different test pattern at its output for testing. As a result, in most SoC environments, each of the devices will generally have its own individual parallel checker. This is undesirable, as multiple parallel checkers within a single SoC environment consumes large amounts power and area on the chip.

BRIEF SUMMARY

The present disclosure is directed to a parallel checker for testing communication devices, such as high-speed serial receivers. The parallel checker is independent of test pattern length and data width at the parallel input of the parallel checker. Accordingly, the parallel checker may be used for multiple different test patterns, such as a PRBS 7, a CJTPAT, CRPAT, etc. Further, the parallel checker provides high-speed synchronization between data received from device under test (DUT) and expected test data stored in the parallel checker. In addition, the parallel checker consumes relatively low power and chip area in, for example, a SoC environment.

According to one embodiment, a system includes a test pattern generator, a DUT, and a parallel checker. The parallel checker includes a zero padding unit, a content addressable memory (CAM), a controller, delay units, and a checker.

The test pattern generator generates a test pattern to be injected into the DUT. The test pattern generator may provide the test pattern to the DUT serially or in parallel. The DUT receives a word of the test pattern from the test pattern generator, processes the word of the test pattern, and then outputs a P-bit word in parallel to the zero padding unit of the parallel checker. The width of the word of the test pattern received by the DUT may or may not be equal to the output width of the DUT (i.e., P-bits).

The zero padding unit pads the P-bit word with zeroes such that the P-bit word has N number of bits. The zero padding unit outputs the N-bit word to the CAM and the checker.

The CAM stores expected data words of the test pattern generated by the test pattern generator. The expected words are words that should be output from the DUT when the DUT is functioning correctly.

The CAM performs a synchronization process by comparing the N-bit word received from the zero padding unit to the expected words stored in the CAM, and providing a matching address to the controller. The matching address is the address of an expected word stored in the CAM matching the N-bit word. The CAM also provides a hit signal to the controller along with the matching address to signify that synchronization is complete. Once synchronization is complete, the controller increments the address of the CAM starting at the matching address by a number equal to the data width of the P-bit word. Successive words stored in the CAM 20 after P locations may be compared with successive words of the test pattern starting at the matching address.

The controller receives the matching address and the hit signal from the CAM 20. In response to receiving the matching address and the hit signal, the controller initializes the CAM and the checker to begin checking successive N-bit words of the test pattern for erroneous bits. The controller initializes the checking process by providing a CAM disable signal to the CAM, a synchronized address to the CAM, and a checker enable signal to the checker.

The CAM disable signal switches the CAM from a content addressable memory mode to a standard memory mode. Subsequent to switching the CAM from a content addressable memory mode to a standard memory mode, the controller provides a synchronized address to the CAM. Initially, the synchronized address will be the matching address that the controller received from the CAM, as the first synchronized address is used as a starting point for the checking process. In response to receiving the synchronized address from the controller, the CAM outputs the data or word at the synchronized address to the checker.

The checker enable signal turns on the checker. Once enabled, the checker compares the expected word received from the CAM and the N-bit word received from the zero padding unit, and calculates a total error count and a total word count.

The delay units add latency to the outputs of the zero padding unit and the controller such that the checker receives the N-bit word from the zero padding unit, the expected word from the CAM, and the checker enable signal from the controller at the same time.

Once the checker has calculated the total bit error count and the total word count for a currently received N-bit word and expected word, the controller prepares the next expected word for the next N-bit word of the test pattern by incrementing the synchronized address by P. The checking process continues until all of the words of the test pattern generated by the test pattern generator have been injected into the DUT, and the output of the DUT has been checked by the parallel checker.

According to one embodiment, a method for testing the DUT using the parallel checker includes the test pattern generator generating and providing a first word of a test pattern to the DUT. The DUT receives the first word of the test pattern from the test pattern generator, processes the first word of the test pattern, and then outputs a P-bit word to the parallel checker.

The zero padding unit pads the P-bit word to an N-bit word and provides the N-bit word to the CAM. In response, the CAM provides a matching address and a hit signal to the controller. Subsequently, the controller disables the CAM by sending a CAM disable signal to the CAM.

The controller then begins a checking process to calculate a total bit error count and a total word count of the test pattern. The controller provides a synchronized address to the CAM. Initially, the synchronized address will be the matching address that the controller received from the CAM, as the first synchronized address is used as a starting point for the checking process. Next, the checker receives the N-bit word from the zero padding unit, an expected word from the CAM, and a checker enable signal from the controller. The checker compares the N-bit word received from the zero padding unit to the expected word received from the CAM, and updates a total bit error count and a total word count. Once the total bit error count and a total word count have been updated, it is determined whether the test pattern generated by the test pattern generator is complete. If the test pattern is complete, the method ends. If the test pattern is not complete, the controller updates the synchronized address to the next expected word, and then performs the checking process again to check the next word of the test pattern and update the total bit error count and the total word count.

DETAILED DESCRIPTION

Figure 1:
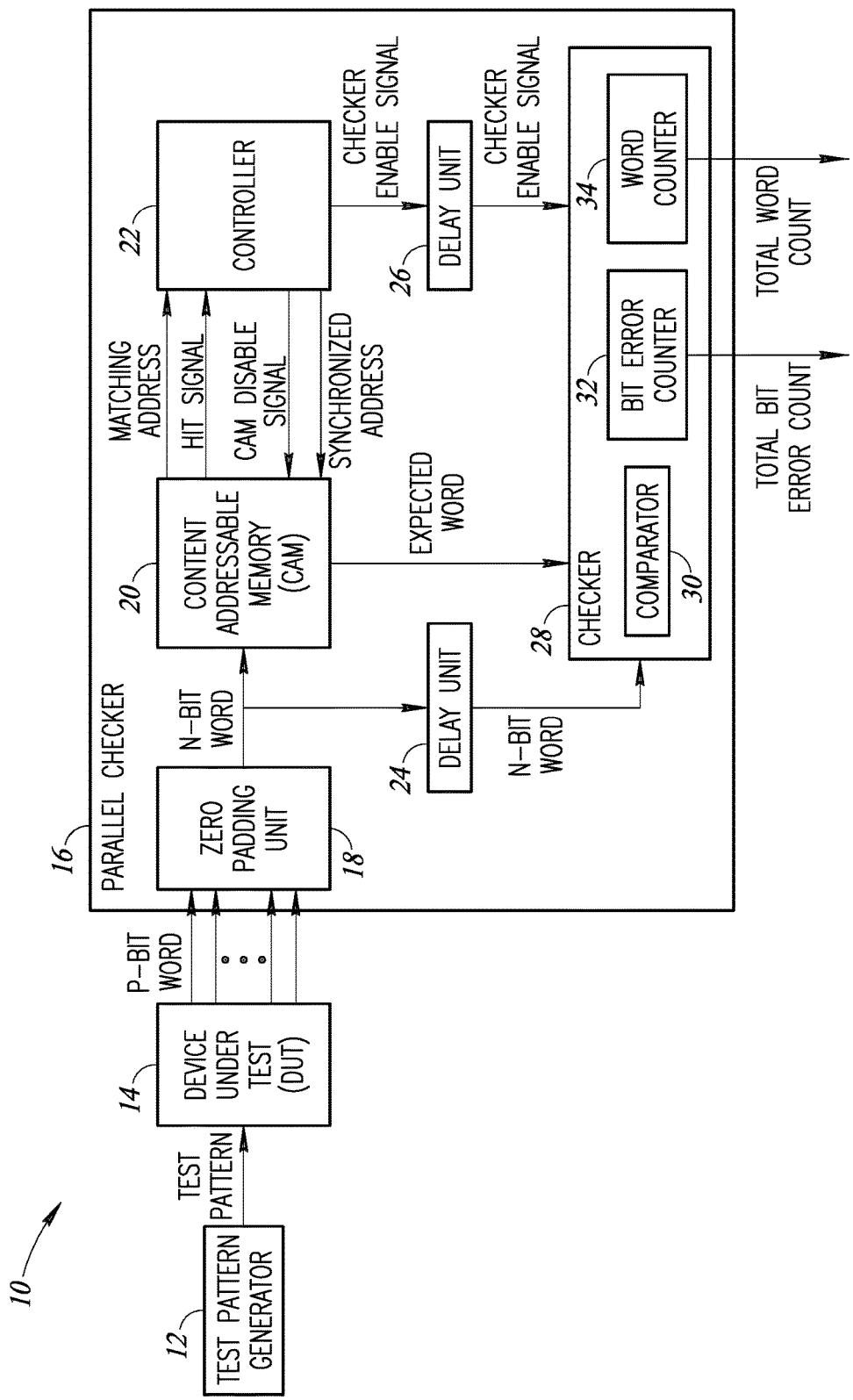
FIG. 1 shows a block diagram of a system including a parallel checker, according to one embodiment disclosed herein.

In the following description, certain specific details are set forth in order to provide a thorough understanding of various embodiments of the disclosure. However, one skilled in the art will understand that the disclosure may be practiced without these specific details. In some instances, well-known details associated with parallel checkers, test patterns, and content addressable memory have not been described, to avoid obscuring the descriptions of the embodiments of the present disclosure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

FIG. 1 shows a block diagram of a system 10 including a parallel checker 16, according to one embodiment disclosed herein.

The system 10 is used to test a device under test (DUT) 14 to determine whether the DUT 14 is functioning properly or outputting erroneous bits. A test pattern or test data is injected into the DUT 14, and output data of the DUT 14 is compared to expected data. The parallel checker 16 determines an error in the event that a bit in the output data received from the DUT 14 does not match in the expected data stored in the parallel checker 16. The system 10 includes a test pattern generator 12, the DUT 14, and the parallel checker 16. The parallel checker 16 includes a zero padding unit 18, a content addressable memory (CAM) 20, a controller 22, delay units 24 and 26, and a checker 28.

The test pattern generator 12 generates a test pattern to be injected into the DUT 14. In one embodiment, the test pattern generator 12 generates the data of the test pattern according to particular specifications of the DUT 14. The test pattern may be one of multiple different types of patterns. For example, the test pattern may be a pseudo-random binary sequence (PRBS), a compliant jitter tolerance pattern (CJTPAT), a continuous random test pattern (CRPAT), etc. Further, the test pattern may have any length. For instance, the test pattern may be PRBS 3, PRBS 7, etc. In one embodiment, jitter is incorporated into the test pattern.

The test pattern generator 12 generating a PRBS 3 test pattern organized into a plurality of words will be used throughout the present disclosure for explanatory purposes. It is to be understood, however, that any test pattern may be used, and the data of the test pattern may be organized in multiple different ways. Table 1 below provides an example of a PRBS 3 test pattern based on the sequence 1011000.

TABLE 1

Example of PRBS 3 test pattern generated by the test pattern generator 12.

| Word number | Used bits | P-bit words |
|---|---|---|
| 1 | <u>101</u>1000 | 101 |
| 2 | 1<u>011</u>000 | 100 |
| 3 | 10<u>110</u>00 | 010 |
| 4 | 101<u>100</u>0 | 110 |
| 5 | 1011<u>000</u> | 001 |
| 6 | 1<u>011</u>000 | 011 |
| 7 | 10<u>11000</u> | 000 |

In the example shown in Table 1, the PRBS 3 test pattern includes word numbers 1 to 7, and each word includes 3 bits. Word numbers 1 to 7 are generated from the pseudo random sequence 1011000. In particular, the words are generated by using 3 bits of 1011000 starting from the first bit (i.e., the most significant bit) for word number 1, 3 bits of 1011000 starting from the fourth bit for word number 2, 3 bits of 1011000 starting from the seventh bit, and so on. Note that word number 3 wraps back to the beginning of 1011000 to form its 3-bit word. The test pattern generator 12 outputs word numbers 1 to 7 in sequential order to the DUT 14. It is important to note, however, the test pattern generator 12 may not necessarily start from word number 1. Rather, the test pattern generator 12 may start from any of the words and return to word number 1 after word number 7 is outputted. For example, the test pattern generator 12 may output the PRBS 3 test pattern in the order of word numbers 4, 5, 6, 7, 1, 2, and 3.

The DUT 14 receives a first word of the test pattern from the test pattern generator 12, processes the first word of the test pattern, and then outputs a P-bit data or word to the parallel checker 16. The DUT 14 outputs the bits of the P-bit word in parallel to the parallel checker 16. In an ideal case, the P-bit word will match the word received from the test pattern generator 12 exactly. For example, referring to the example of Table 1, if the DUT 14 receives word number 2 (100), the DUT 14 outputs the bits of the 3-bit word in parallel to the parallel checker 16. If the DUT 14 is functioning properly, the output of the DUT 14 will match word number 2 and be 100.

The DUT 14 may be any type of device that receives and outputs data. In one embodiment, the DUT 14 is a communication device, such as a high-speed serial receiver, a high-speed serial optical interface, and a hard disk device interface.

The parallel checker 16 tests the DUT 14 by determining whether the P-bit word matches an expected word or contains erroneous bits. As will be discussed in further detail below, in one embodiment, the parallel checker calculates a total error count and a total word count to provide a bit error rate (BER) of the DUT 14. The parallel checker 16 receives the P-bit word from the DUT 14. In particular, the zero padding unit 18 of the parallel checker 16 receives the bits of the P-bit word in parallel.

Assuming P is equal to or less than N, the zero padding unit 18 pads the P-bit word with zeroes such that the P-bit word has N number of bits. For example, referring to the example of Table 1, if N=7, the zero padding unit 18 adds 4 zeroes to the 3-bit word outputted by the DUT 14. In one embodiment, N is equal to the maximum number of bits that the parallel checker 16 is capable of processing. For instance, if the parallel checker 16 is capable of checking up to 40-bit words, N is equal to 40. In this example, the zero padding unit 18 will pad a 20-bit word with 20 zeroes. The zero padding unit 18 outputs the N-bit data or word to the CAM 20 and the checker 28. In one embodiment, the zero padding unit 18 adds zeroes to the beginning of the P-bit word. Namely, the zero padding unit 18 adds zeroes starting from the most significant bit of the P-bit word. For example, if the P-bit word is 110 and N=7, the N-bit word will be 0000110.

Figure 2:
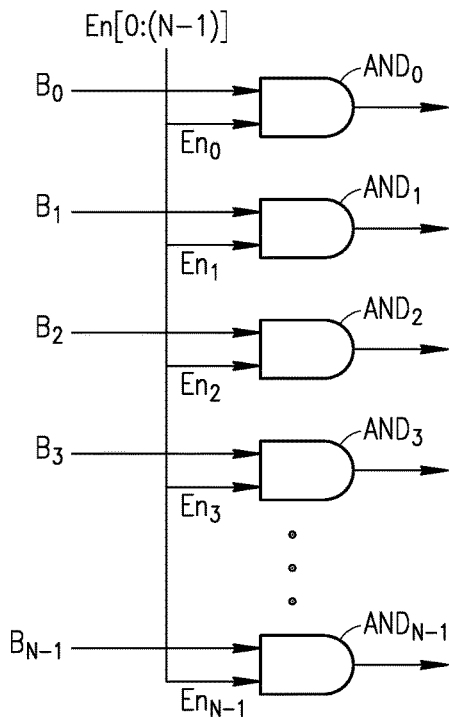
FIG. 2 shows a block diagram of a zero padding unit, according to one embodiment disclosed herein.

FIG. 2 shows a block diagram of the zero padding unit 18, according to one embodiment disclosed herein.

In the embodiment shown in FIG. 2, the zero padding unit 18 includes a plurality of AND gates $AND_0$ to $AND_{N-1}$. As previously discussed, the zero padding unit 18 pads the P-bit word to have N bits. The number of AND gates is equal to N. For example, if N=7, the zero padding unit 18 includes 7 AND gates. Each of the AND gates $AND_0$ to $AND_{N-1}$ includes a first input connected to the DUT 14 and a second input connected to a dedicated enable line $En_0$ to $En_{N-1}$. Each of the first inputs of the AND gates $AND_0$ to $AND_{N-1}$ receives a single bit of the P-bit word from the DUT 14, starting from the first bit of the P-bit word. For example, if the P-bit word is 110, AND gate $AND_0$ receives 1, AND gate $AND_1$ receives 1, and AND gate $AND_2$ receives 0. The enable lines $En_0$ to $En_{N-1}$ enable (i.e., apply logic 1) to the first P number of AND gates of the AND gates $AND_0$ to $AND_{N-1}$, and disable (i.e., apply a logic 0) to the remaining AND gates. Namely, enable lines $En_0$ to $En_P$ will apply a logic 1 to each of the first inputs of AND gates $AND_0$ to $AND_{P-1}$, and a logic 0 to each of the first inputs of AND gates $AND_P$ to $AND_{N-1}$. As a result, bits $B_0$ to $B_{P-1}$ will be passed through the zero padding unit 18, and the remaining bits $B_P$ to $B_{N-1}$ will output a zero.

Returning to FIG. 1, the CAM 20 receives the N-bit word from the zero padding unit 18. The CAM 20 is a content addressable memory. In contrast to a traditional memory that receives an address as an input and returns data at the address, the CAM 20 performs content matching. Namely, the CAM 20 receives data as an input and returns the address of the location in which the data is stored in the CAM 20. This content matching search mechanism enables the CAM 20 to search data in a single cycle, which makes it much faster than traditional memories, such as random access memory (RAM).

The CAM 20 has a size M×N. M is the number of address locations in the CAM 20, and N is width of each of the address locations. The size of the CAM 20 determines maximum test pattern length (i.e., the number of words of the test pattern) and maximum width (i.e., number of bits) of each of the words of the test pattern that may be used to test the DUT 14. Thus, M is equal to or greater than the test pattern length, and N is equal to or greater than the width of each of the words of the test pattern. For example, referring to the PRBS 3 test pattern of Table 1, M is equal to or greater than 7 as the PRBS 3 outputs 7 words, and N is equal to or greater than 3, as each word includes 3 bits.

The CAM 20 stores expected data words of the test pattern generated by the test pattern generator 12. The expected words are words that should be output from the DUT 14 when the DUT 14 is functioning correctly. As will be discussed in further detail, the checker 28 compares the N-bit words from the zero padding unit 18 with the expected words to determine whether the DUT 14 is outputting erroneous bits. The expected words are sequentially stored in the CAM 20 at respective address locations.

In one embodiment, the expected words match the test pattern generated by the test pattern generator 12 after zero padding is performed. For example, referring to the PRBS 3 test pattern of Table 1, the expected word for word number 2 (100) is 0000100. Thus, in this example, the DUT 14 is functioning correctly when the N-bit word outputted from the zero padding unit 18 is 0000100. Table 2 below provides an example of expected words stored in the CAM 20 for the PRBS 3 test pattern of Table 1 when N=7.

TABLE 2

Example of expected words stored in the CAM 20 for the PRBS 3 test pattern of Table 1 when N = 7.

| Expected words | Address |
| --- | --- |
| 0000101 | A1 |
| 0000011 | A2 |
| 0000110 | A3 |
| 0000100 | A4 |
| 0000000 | A5 |
| 0000001 | A6 |
| 0000010 | A7 |

As shown in Table 2, the CAM 20 stores the expected words for the PRBS 3 test pattern at address locations A1 to A7. In particular, as the PRBS 3 test pattern is based on the sequence 1011000, the expected word for the first 3 bits of the sequence 1011000 starting from the first bit (i.e., the most significant bit) is stored in address location A1 (0000101, which is 101 with zero padding); the expected word for the next 3 bits of the sequence 1011000 starting from the second bit is stored in A2 (0000011, which is 011 after zero padding); the expected word for the next 3 bits of the sequence 1011000 starting from the third bit is stored in A3 (0000110, which is 110 after zero padding) is stored in A3; and so on. Note that the expected word for the 3 bits of the sequence 1011000 starting from the sixth bit wraps back to the beginning of 1011000. Accordingly, the expected words for word numbers 1 to 7 of the test pattern are stored at the addresses A1, A4, A7, A3, A6, A2, and A5, respectively. In one embodiment, the CAM 20 stores expected words for multiple different test patterns. For example, the CAM 20 may store expected words for a PRBS 3 similar to Table 2 plus additional expected words for other test patterns, such as a PRBS 7, a CJTPAT, CRPAT, etc. As a result, the parallel checker 16 may be used with multiple different test patterns to test multiple different DUTs.

As previously discussed, although the test pattern generator 12 sequentially outputs words of the test pattern to the DUT 14, the test pattern generator 12 may not necessarily start from the beginning (i.e., the first word) of the test pattern. The test pattern generator 12 may start at any of the words of the test pattern. For example, referring to the PRBS 3 test pattern of Table 1, the test pattern generator 12 may start at word number 4. Further, the CAM 20 may store expected words for multiple different test patterns. Accordingly, the parallel checker 16 performs a synchronization process to align the test pattern generated by the test pattern generator 12 with the expected words stored in the CAM 20, and to ensure that an N-bit word is compared with its corresponding expected word. For example, referring to the example of Table 1, if the test pattern generator 12 outputs the test pattern in the order of word numbers 2, 3, 4, 5, 6, 7, and 1, the synchronization process ensures that the checker 28 compares the word numbers 2, 3, 4, 5, 6, 7, and 1 with expected words for the word numbers 2, 3, 4, 5, 6, 7, and 1, respectively. If synchronization is not performed, the parallel checker 16 may compare an N-bit word with the wrong expected word stored in the CAM 20, and falsely identify erroneous bits.

The CAM 20 performs synchronization by comparing the first N-bit word received from the zero padding unit 18 to the expected words stored in the CAM 20, and returning a matching address. The matching address is the address of an expected word stored in the CAM 20 matching the first N-bit word. For example, referring to the example of Tables 1 and 2, if the first N-bit word is 0000100, the CAM 20 returns address A4. The CAM 20 provides the matching address to the controller 22.

In one embodiment, in the event that the first N-bit word is not found in the CAM 20, the CAM 20 uses the subsequent N-bit word received from the zero padding unit 18 for synchronization. In one embodiment, in the event that none of the N-bit words received from the zero padding unit 18 is found in the CAM 20, the parallel checker 16 may be configured to return an error.

The CAM 20 also provides a hit signal to the controller 22 along with the matching address. The hit signal signifies that synchronization is complete. Once synchronization is complete, words stored at $P^{th}$ successive locations in the CAM 20 may be compared with successive words of the test pattern starting at the matching address. As previously discussed, the test pattern generator 12 sequentially outputs words of the test pattern to the DUT 14. For example, referring to the PRBS 3 test pattern of Table 1, the test pattern generator 12 may output the PRBS 3 test pattern in the order of word numbers 2, 3, 4, 5, 6, 7, and 1. Further, as previously discussed, the CAM 20 stores the expected words for the PRBS 3 test pattern at respective address locations. For example, referring to Table 2, expected words for word numbers 1 to 7 of the test pattern are stored at the addresses A1, A4, A7, A3, A6, A2, and A5, respectively. Accordingly, once synchronization has been completed, successive words stored at $P^{th}$ successive locations in the CAM 20 will correspond to successive words of the test pattern generated by the test pattern generator 12 starting at the matching address. Thus, words stored at $P^{th}$ successive locations in the CAM 20 will be compared with successive words of the test pattern starting at the matching address. For example, referring to the example of Tables 1 and 2, if the first N-bit word is 0000100 (word number 2) and the matching address is A4, word number 3 will be compared with the data stored at address A7 (4+3), word number 4 will be compared with the data stored at address A3 (7+3), word number 5 will be compared with the data stored at address A6 (3+3), word number 6 will be compared with the data stored at address A2 (6+3), word number 7 will be compared with the data stored at address A5 (2+3), and word number 1 will be compared with the data stored at address A1 (5+3).

As previously discussed, the content matching search mechanism of the CAM 20 enables the CAM 20 to search data in a single cycle. As a result, unlike synchronization processes of conventional parallel checkers that may take milliseconds, the CAM 20 provides high-speed synchronization between the data received from the DUT 14 and the expected test data stored in the CAM 20.

The controller 22 receives the matching address and the hit signal from the CAM 20. In response to receiving the matching address and the hit signal, the controller 22 initializes the CAM 20 and the checker 28 to begin checking the N-bit words of the test pattern for erroneous bits. The controller 22 initializes the checking process by providing a CAM disable signal to the CAM 20, a synchronized address to the CAM 20, and a checker enable signal to the checker 28.

The CAM disable signal switches the CAM 20 from a content addressable memory mode to a standard memory mode. In the content addressable memory mode, as previously discussed, the CAM 20 receives data as an input and returns the address of the location in which the data is stored in the CAM 20. In the standard memory mode, the CAM 20 behaves similar to traditional memory, such as RAM. Namely, the CAM 20 receives an address as an input and returns data at the address. While the CAM 20 is in the standard memory mode, any further assertions, if any, of a HIT signal by the CAM 20 are ignored by the controller 22.

Subsequent to disabling the CAM 20 (i.e., switching the CAM 20 from a content addressable memory mode to a standard memory mode), the controller 22 provides a synchronized address to the CAM 20. Initially, the synchronized address will be the matching address that the controller 22 received from the CAM 20, as the first synchronized address is used as a starting point for the checking process. For example, referring to the example of Table 2, if the matching address is A4, the synchronized address will be A4. As will be discussed in further detail below, the synchronized address is incremented by P during the checking process. In response to receiving the synchronized address from the controller 22, the CAM 20 outputs the data or word at the synchronized address to the checker 28. For example, referring to the example of Tables 1 and 2, if the synchronized address will be A4, the CAM 20 will output word number 4 (0000100) to the checker 28.

Erase RAMs are typically used to improve erase time of a CAM by allowing data in the CAM to be cleared in a single cycle. In general, the erase RAM is an exact copy of the contents of the CAM. The erase RAM is used to provide data currently stored at the location to be erased at the input of the CAM. In one embodiment, the CAM 20 includes an erase RAM. In this embodiment, the erase RAM is an exact copy of the CAM 20 and, thus, also stores the expected words. In response to receiving the synchronized address from the controller 22, the erase RAM outputs the data or word at the synchronized address to the checker 28.

As the CAM 20 is used both as a content addressable memory and a traditional memory, the parallel checker 16 uses a single content addressable memory. A separate memory, such as an external RAM, is not needed to store the expected words. As a result, the parallel checker 16 may consume a relatively low power and chip area in, for example, a SoC environment.

The checker enable signal turns on the checker 28. As will be discussed in further detail below, once enabled, the checker 28 will begin comparing the expected word received from the CAM 20 and the N-bit word received from the zero padding unit 18, and calculating a total error count and a total word count.

As shown in FIG. 1, the parallel checker 16 includes a delay unit 24 and a delay unit 26. The delay units 24 and 26 introduce latency in the parallel checker 16 to synchronize the outputs of the zero padding unit 18, the CAM 20, and the controller 22 to the checker 28. Namely, the delay unit 24 adds latency to the output of the zero padding unit 18, and the delay unit 26 adds latency to the output of the controller 22, such that the checker receives the N-bit word from the zero padding unit 18, the expected word from the CAM 20, and the checker enable signal from the controller 22 at the same time. In one embodiment, the delay unit 24 and the delay unit 26 each introduces a number of cycles equal to the number of cycles from the time the CAM 20 receives the N-bit word from the zero padding unit 18 to the time the CAM 20 outputs the expected word to the checker 28. In one embodiment, the delay unit 24 and the delay unit 26 are flip-flop chains.

As previously discussed, the controller 22 outputs the CAM disable signal in response to receiving the hit signal from the CAM 20. In one embodiment, the controller 22 waits for multiple hit signals from the CAM 20 before outputting the CAM disable signal to the CAM 20. Waiting for multiple hit signals is beneficial in cases where width of the data at the input of the parallel checker 16 is small to ensure that a hit signal is not coming because of raw data. For example, a CJTPAT test pattern typically includes a large number of consecutive ones and zeroes. As such, it is likely that a word such as 000 or 111 will have multiple matches in the CAM 20. If the CAM 20 returns multiple matches, it is unknown whether the expected words stored in the CAM 20 are properly synchronized. Thus, to ensure that an N-bit word is compared with its corresponding expected word, the controller 22, in one embodiment, waits for a number of multiple consecutive hit signals, where the number of multiple consecutive hit signals is low, before outputting the CAM disable signal.

In another case, if a pattern resides at multiple places inside the CAM 20, it is likely that an N-bit word received by the CAM 20 will return multiple address matches in the CAM 20. In this embodiment, a Multiple_Match signal from CAM will be high, indicating that an incoming pattern is found at multiple places inside the CAM. Thus, the incoming pattern cannot be considered for synchronization. For example, a CJTPAT test pattern typically includes a large number of consecutive ones and zeroes. As such, it is likely that a word such as 000 or 111 will have multiple matches in the CAM 20. If the CAM 20 returns multiple matches, it is unknown whether the expected words stored in the CAM 20 are properly synchronized. Thus, to ensure that an N-bit word is compared with its corresponding expected word, the controller 22, in one embodiment, waits for a HIT signal with the Multiple_match signal from CAM 20 being low. Consecutive hit signals can be considered for accurate synchronization.

In one embodiment, the controller 22 is a state machine with three states: an idle state, a synchronization state, an address state. In the idle state, the controller 22 is waiting for the matching address and the hit signal. In the synchronization state, the controller 22 receives the matching address and the hit signal. In the address state, the controller 22 outputs the CAM disable signal and the synchronized address to the CAM 20, and the checker enable signal to the checker 28. While in the address state, as will be discussed in further detail below, the controller 22 increments the synchronized address by P to provide a subsequent expected word to compared with a subsequent N-bit word.

As previously discussed, the checker 28 receives the checker enable signal from the controller 22, the N-bit word from the zero padding unit 18, and the expected word from the CAM 20. The checker 28 includes a comparator 30, a bit error counter 32, and a word counter 34.

The comparator 30 compares an N-bit word received from the zero padding unit 18 to an expected word received from the CAM 20, and determines if there are any differences between the N-bit word and the expected word. For example, if the comparator 30 receives a word 0000101 from the zero padding unit 18 and an expected word 0000100 from the CAM 20, the comparator will determine that the least significant bit of 0000101 is different from 0000100. This difference represents a single bit error in the output of the DUT 14.

The error counter 32 determines a bit error count for the current N-bit word received from the zero padding unit 18, and determines a total bit error count by adding the current bit error count to a previous bit error count. For the first N-bit word received from the zero padding unit 18, the previous bit error count will be equal to zero. The total bit error count represents the total number of errors in the output of the DUT 14 in response to being injected with the test pattern from the test pattern generator 12.

The word counter 34 determines a total word count of N-bit words processed by the checker 28. The word counter 34 calculates the total word count by incrementing a counter every time an N-bit word is received from the zero padding unit 18. In another embodiment, the word counter 34 counts the total number of bits.

By using the total bit error count and the total word count together, a BER of the output of the DUT 14 in response to being injected with the test pattern from the test pattern generator 12 may be determined. BER is particularly important for critical applications, such as satellites, medical applications, etc., where accuracy is a primary concern and a BER of $10^{-15}$ or lower is required.

It is important to note that for the parallel checker 16 to be applicable for current high-speed serial standards, the comparator 30, the bit error counter 32, and the word counter 34 should work at very high frequencies.

Figure 3:
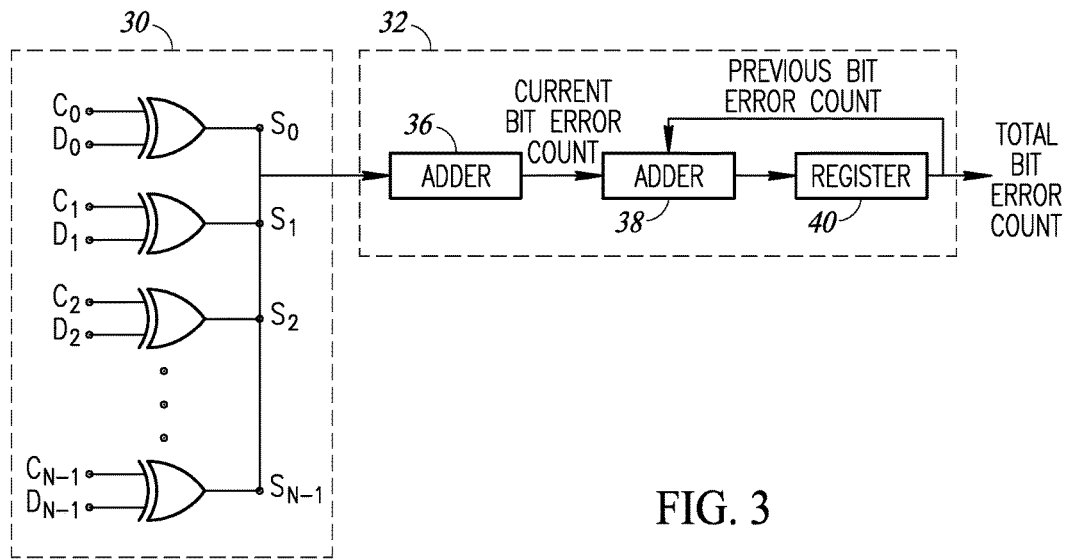
FIG. 3 shows a block diagram of a comparator and an error counter, according to one embodiment disclosed herein.

FIG. 3 shows a block diagram of the comparator 30 and the bit error counter 32, according to one embodiment disclosed herein. The comparator 30 and the bit error counter 32 are capable of operating at high frequencies.

The comparator 30 includes a plurality of XOR gates. In one embodiment, as shown in FIG. 3, the comparator 30 includes an XOR gate for each bit of the N-bit word received from the zero padding unit 18. Each of the XOR gates includes a first input connected to the zero padding unit 18 to receive a respective bit of bits $C_0$ to $C_{N-1}$ of the N-bit word, a second input connected to the CAM 20 to receive a respective bit of bits $D_0$ to $D_{N-1}$ of the expected word, and outputs $S_0$ to $S_{N-1}$. Each of the XOR gates compares the bits on the first and second inputs, and outputs a logic 1 when the bits on the first and second inputs do not match. Thus, each logic 1 outputted by the XOR gates represents a single bit error in the N-bit word. The outputs $S_0$ to $S_{N-1}$ of the XOR gates are provided to the error counter 32.

The error counter 32 includes a first adder 36, a second adder 38, and a register 40. The first adder 36 receives the outputs $S_0$ to $S_{N-1}$ from the XOR gates of the comparator 30, and calculates a current bit error count of the current N-bit word by adding the outputs $S_0$ to $S_{N-1}$ together. As previously discussed, each logic 1 outputted by the XOR gates represents a single bit error in the N-bit word. Thus, the total logic 1s outputted by the XOR gates of the comparator 30 represents the total bit error count of the current N-bit word. The first adder 36 provides the current bit error count to the second adder 38. The second adder 38 calculates a total bit error count by adding the current bit error count to a previous bit error count stored in the register 40. As previously discussed, the previous bit error count will be equal to zero for the first N-bit word received from the zero padding unit 18. Further, as previously discussed, the total bit error count represents the total number of errors in the output of the DUT 14 in response to being injected with the test pattern from the test pattern generator 12. The second adder 38 stores the total bit error count in the register 40 to output the total bit error count and to provide the total bit error count to the second adder 38 for future calculations.

Figure 4:
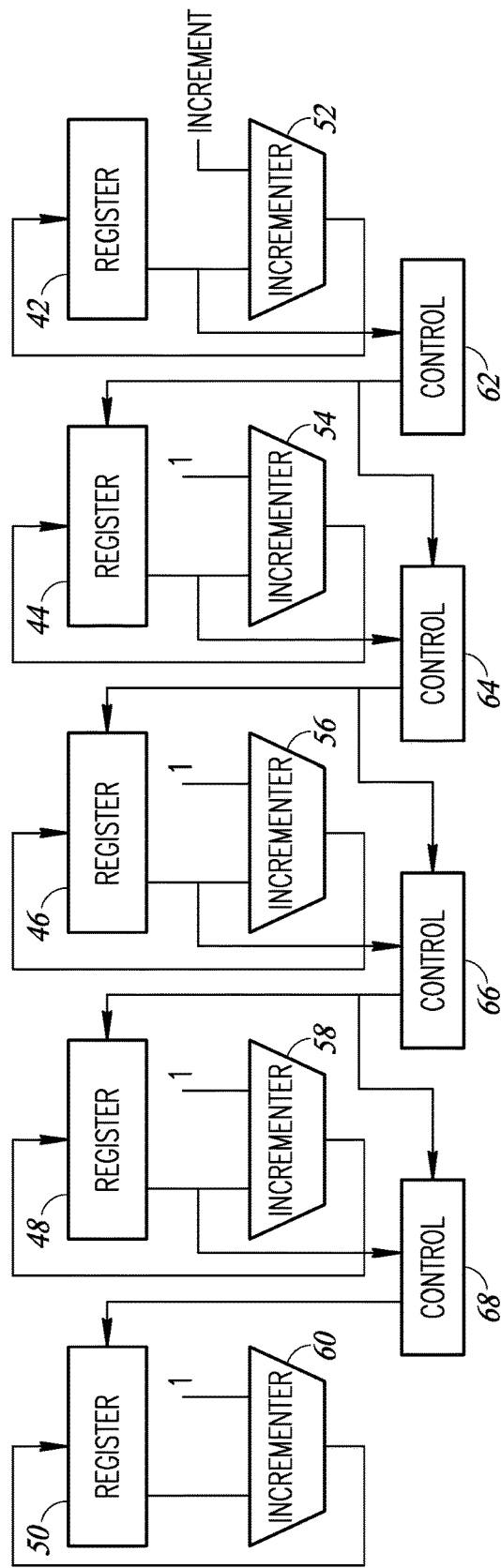
FIG. 4 shows a block diagram of a word counter, according to one embodiment disclosed herein.

FIG. 4 shows a block diagram of the word counter 34, according to one embodiment disclosed herein. Similar to the comparator 30 and the error counter 32, the word counter 34 is capable of operating at high frequencies.

In the embodiment shown in FIG. 4, the word counter 34 is a multi-stage counter that increments a word count with a passage of each N-bit word. In particular, the word counter is a 5-stage counter that includes registers 42, 44, 46, 48, and 50; incrementers 52, 54, 56, 58, and 60; and controls 62, 64, 66, and 68. The first stage counter includes register 42 and incrementer 52; the second stage counter includes register 44 and incrementer 54; the third stage counter includes register 46 and incrementer 56; the fourth stage counter includes register 48 and incrementer 58; and the fifth stage counter includes register 50 and incrementer 60. Although only five stages are shown in FIG. 4, the word counter 34 may include any number of stages.

The registers 42, 44, 46, 48, and 50 store the current word count for the first, second, third, fourth, and fifth stages, respectively. Initially, each of the registers has a value of zero. When in operation, the first stage counter, specifically the incrementer 52, receives an increment signal each time the checker 28 receives an N-bit word. In response to receiving an increment, the incrementer 52 increments a count stored in the register 42. While the first stage counter is active (i.e., counting), the remaining stages remain idle. The first stage counter continues to increment each time an increment signal is received until the register 42 overflows or reaches its maximum value (e.g., 1111111 when register 42 is a 7-bit register). When the register 42 overflows, the control 62 asserts a flag for the second stage counter to begin incrementing. When the second stage counter overflows, counter 64 asserts a flag for the third stage counter to begin incrementing. This process cascades through each stage until the last N-bit word is received from the zero padding unit 18. When the last N-bit word is received, the final word count is obtained by reading the final word counts stored in the registers 42, 44, 46, 48, and 50.

Returning to FIG. 1, as previously discussed, the checker 28 receives an N-bit word from the zero padding unit 18 and an expected word from the CAM 20. Once the checker 28 has calculated the total bit error count and the total word count for the currently received N-bit word and expected word, the controller 22 prepares the next expected word for the next N-bit word of the test pattern by updating the synchronized address. As previously discussed, the test pattern generator 12 sequentially outputs words of the test pattern to the DUT 14. As a result, words stored at $P^{th}$ successive locations in the CAM 20 will correspond to successive words of the test pattern generated by the test pattern generator 12 starting at the matching address. Accordingly, the controller 22 provides the synchronized address for the next expected word, which corresponds to the next N-bit word, by setting the synchronized address to the $P^{th}$ subsequent address from the current address of the CAM 20. For example, referring to the example of Table 2, if the current synchronized address is A4, the controller 22 will increment the synchronized address to A7.

In one embodiment, the controller 22 increments the synchronized address based on the data width (i.e., number of bits) of the expected words. Namely, in one embodiment, the next synchronized address is generated using the following equation: Next synchronized address=(Current synchronized address+data width of expected words) % Test pattern length. In other words, the next synchronized address may be calculated as the remainder of the division of the sum of the current synchronized address and the data width of expected words by the test pattern length.

Once the synchronized address has been updated, the synchronized address is provided to the CAM 20, which in turn outputs the expected word at the received synchronized address to the checker 28. Subsequently, the checker 28 compares the expected word with the next N-bit word received from the zero padding unit 18 as previously discussed, to update the total bit error count and the total word count. As will be discussed in further detail with respect to FIG. 5, this process continues until all of the words of the test pattern generated by the test pattern generator 12 have been injected into the DUT 14, and the output of the DUT 14 has been checked by the parallel checker 16.

Figure 5:
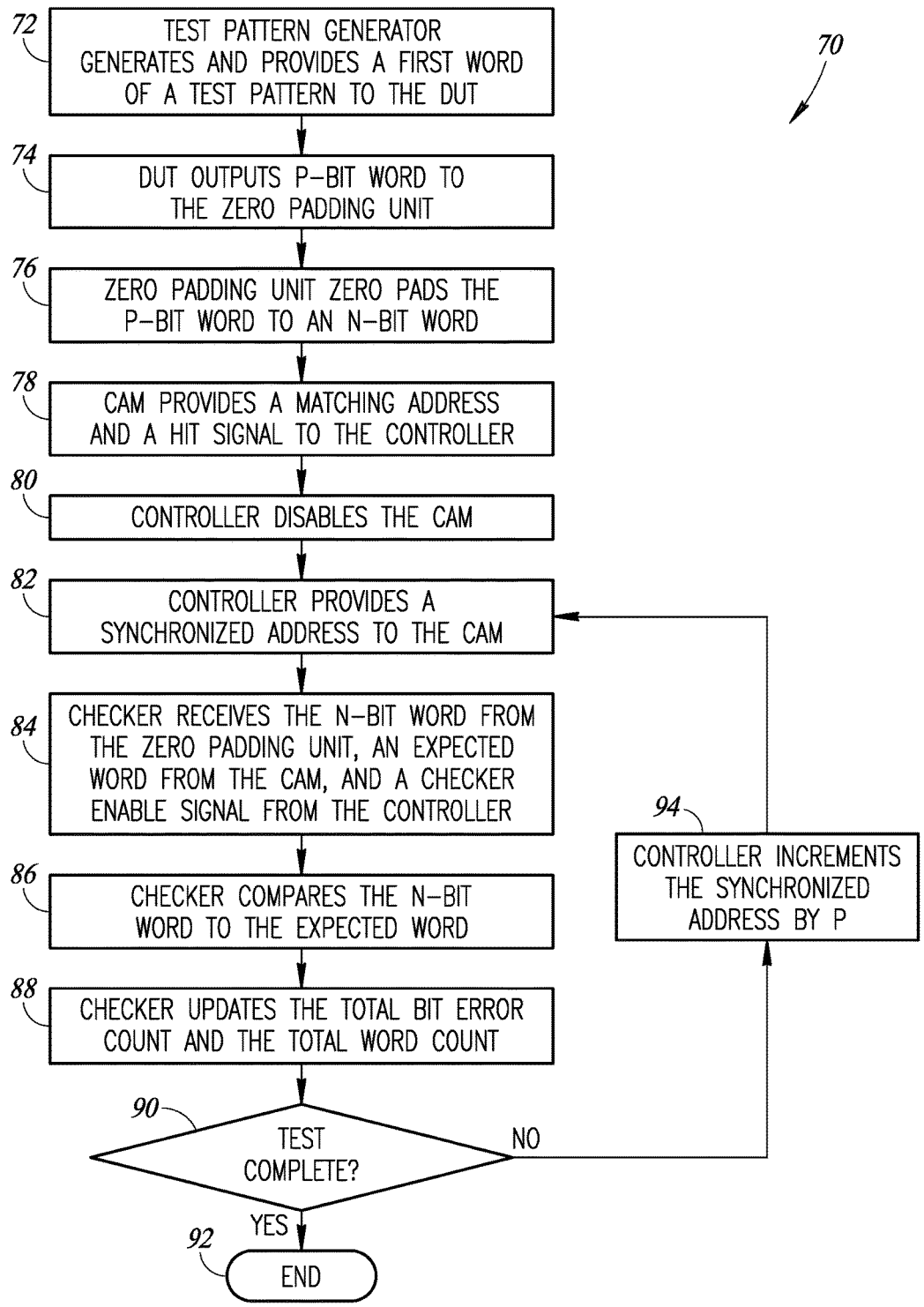
FIG. 5 shows a flow diagram of a method for testing a device under test using a parallel checker, according to one embodiment disclosed herein.

FIG. 5 shows a flow diagram of a method 70 for testing the DUT 14 using the parallel checker 16, according to one embodiment disclosed herein.

In step 72, the test pattern generator 12 generates and provides a first word of a test pattern to the DUT 14. For example, referring to the example of Table 1, the test pattern generator 12 may generate a PRBS 3 test pattern and output word number 2 (100) to the DUT 14. As previously, discussed the test pattern may be one of multiple different types of patterns. For example, the test pattern may be a PRBS, a CJTPAT, a CRPAT, etc.

In step 74, the DUT 14 outputs a P-bit word to the zero padding unit 18. In particular, the DUT 14 receives the first word of the test pattern from the test pattern generator 12, processes the first word of the test pattern, and then outputs a P-bit word to the parallel checker 16. For example, if the DUT 14 receives word number 2 (100) in step 72, the P-bit word is 3 bits. The DUT 14 outputs the bits of the P-bit word in parallel to the zero padding unit 18.

In step 76, the zero padding unit 18 zero pads the P-bit word to an N-bit word. As previously discussed, in one embodiment, N is equal to the maximum number of bits that the parallel checker 16 is capable of processing. For example, the P-bit word in step 74 is 3 bits and N=7, the zero padding unit 18 adds 4 zeroes to the P-bit word outputted by the DUT 14.

In step 78, the CAM 20 provides the matching address and a hit signal to the controller 22. As previously discussed, the CAM 20 performs a synchronization process by comparing the N-bit word received from the zero padding unit 18 to the expected words stored in the CAM 20, and returning a matching address. The matching address is the address of an expected word stored in the CAM 20 matching the N-bit word. For example, referring to the example of Tables 1 and 2, if the N-bit word in step 76 is 0000100, the CAM 20 returns address A4. The hit signal signifies that synchronization is complete. Once synchronization is complete, words stored at $P^{th}$ successive locations in the CAM 20 may be compared with successive words of the test pattern starting at the matching address.

In step 80, the controller 22 disables the CAM 20 by sending a CAM disable signal to the CAM 20. As previously discussed, the CAM disable signal switches the CAM 20 from a content addressable memory mode to a standard memory mode. In the standard memory mode, the CAM 20 behaves similar to traditional memory that receives an address as an input and returns data at the address.

In step 82, the controller 22 provides a synchronized address to the CAM 20. As previously discussed, initially, the synchronized address will be the matching address that the controller 22 received from the CAM 20 as the first synchronized address is used as a starting point for the checking process. For example, if the matching address is A4 in step 78, the synchronized address is also A4.

In step 84, the checker 28 receives the N-bit word from the zero padding unit 18, an expected word from the CAM 20, and a checker enable signal from the controller 22.

The N-bit word from the zero padding unit 18 is the same N-bit word generated in step 76. The expected word, as previously discussed, is the expected word stored at the synchronized address. For example, referring to the example of Table 2, if the synchronized address is A4 in step 82, the CAM 20 will output 0000100 to the checker 28. The checker enable signal, as previously discussed, turns on the checker 28 to begin comparing the N-bit word with the expected word.

As previously discussed, the checker 28 receives the N-bit word from the zero padding unit 18, an expected word from the CAM 20, and a checker enable signal from the controller 22 simultaneously. Namely, the delay unit 24 adds latency to the output of the zero padding unit 18 and the delay unit 26 adds latency to the output of the controller 22 such that the checker receives the N-bit word from the zero padding unit 18, the expected word from the CAM 20, and the checker enable signal from the controller 22 at the same time.

In step 86, the checker 28 compares the N-bit word to the expected word. In particular, as previously discussed, the comparator 30 of the checker 28 compares the N-bit word received from the zero padding unit 18 to the expected word received from the CAM 20, and determines if there are any differences between the N-bit word and the expected word. Each bit difference between the N-bit word and the expected word represents a single bit error in the output of the DUT 14.

In step 88, the checker 28 updates the total bit error count and the total word count.

In particular, as previously discussed, the error counter 32 determines a bit error count for the current N-bit word received from the zero padding unit 18, and determines a total bit error count by adding the current bit error count to a previous bit error count. Thus, as the current N-bit word is the first word of the test pattern, the previous bit error count equals zero. The total bit error count represents the total number of errors in the output of the DUT 14 in response to being injected with the test pattern in step 72. It should be noted that for the first word of the test pattern, the error counter 32 should determine zero bit errors because the synchronized address in step 82 is the same as the matching address in step 78. Thus, the expected word received in step 84 should match the N-bit word in step 76.

The word counter 34 determines a total word count of N-bit words processed by the checker 28. The word counter 34 calculates the total word count by incrementing a counter every time an N-bit word is received from the zero padding unit 18. Thus, as the current N-bit word is the first word of the test pattern, the total word count is incremented to 1.

In step 90, it is determined whether the test pattern generated by the test pattern generator 12 is complete. That is, it is determined whether the test pattern has additional words to be injected into the DUT 14. If the test pattern is complete the method ends in step 92. If the test pattern is not complete, the method moves to step 94.

In step 94, the controller 22 increments the synchronized address. As previously discussed, the controller 22 increments the synchronized address to the next expected word, which should correspond to the next N-bit word by incrementing the synchronized address to the next $P^{th}$ subsequent address from the current synchronized address of the CAM 20. For example, referring to the example of Table 2, if the synchronized address is A4 in step 82, the controller 22 will increment the synchronized address to A7. As previously discussed, the synchronized address is incremented in this manner as the test pattern generator 12 sequentially outputs words of the test pattern to the DUT 14, and the CAM 20 stores the expected words at respective address locations as discussed with respect to Table 2. Thus, words stored at $P^{th}$ successive locations in the CAM 20 will correspond to successive words of the test pattern generated by the test pattern generator 12 starting at the matching address/first synchronized address. Once the synchronized address has been updated, the method returns to step 82.

In accordance with one or more embodiments, the parallel checker 16 is independent of the test pattern length and the data width at the parallel input of the parallel checker 16. As such, the parallel checker 16 may be used for multiple different test patterns, such as a PRBS 7, a CJTPAT, CRPAT, etc. Further, unlike synchronization processes of conventional parallel checkers, the CAM 20 provides high-speed synchronization between the data received from the DUT 14 and the expected test data stored in the CAM 20. In addition, as the parallel checker 16 uses a single content addressable memory, a separate memory is not needed to store the expected words. Thus, the parallel checker 16 may consume relatively low power and chip area in, for example, a SoC environment.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
receiving, by a content addressable memory (CAM), a first test data from a device;
determining, by the CAM, a first address of data in the CAM that matches the first test data;
providing, by the CAM, the first address to a controller;
receiving, by the controller, the first address from the CAM;
switching, by the controller, the CAM from a content addressable memory mode to a standard memory mode;
determining, by the controller, a second address, the second address being set to the first address or incremented from a current address to a subsequent address;
providing, by the controller, the second address to the CAM;
receiving, by the CAM, the second address from the controller, the CAM receiving the second address while the CAM is in the standard memory mode;
providing, by the CAM, data at the second address to a checker;
receiving, by the checker, the data at the second address from the CAM;
receiving, by the checker, a second test data from the device; and
determining, by the checker, if there are any differences between the data at the second address and the second test data.

2. The method of claim 1, further comprising:
providing, by the CAM, a hit signal with the first address to the controller; and
receiving, by the controller, the hit signal from the CAM, the controller switching the CAM from the content addressable memory mode to the standard memory mode in response to receiving the hit signal.

3. The method of claim 1, further comprising:
delaying the second test data to arrive at the checker at substantially the same time as the data at the second address.

4. The method of claim 1, further comprising:
providing, by the controller, an enable signal to the checker in response to receiving the hit signal.

5. The method of claim 4, further comprising:
delaying the enable signal to arrive at the checker at substantially the same time as the second test data and the data at the second address.

6. The method of claim 1, further comprising:
zero padding the first test data before the CAM receives the first test data.

7. A device, comprising:
an input which, in operation, receives test data;
a content addressable memory (CAM) that stores expected words at respective address locations, the CAM, in operation, determines a first address of an expected word that matches a first word of the test data;
a controller which, in operation, determines a second address, and switches the CAM from a CAM mode to a standard memory mode, the second address being set to the first address or incremented from a current address to a subsequent address, the CAM, in operation, receives the second address and outputs an expected word at the second address while the CAM is in the standard memory mode; and
a checker which, in operation, receives the expected word at the second address and a second word of the test data, and determines if there are any differences between the expected word at the second address and the second word.

8. The device of claim 7 wherein the CAM, in operation, provides a hit signal to the controller in response to the first address being determined.

9. The device of claim 8 wherein the controller, in operation, switches the CAM from the CAM mode to the standard memory mode in response to the hit signal being received.

10. The device of claim 8 wherein the controller, in operation, enables the checker in response to the hit signal being received.

11. The device of claim 7, further comprising:
a zero padding unit which, in operation, adds zeros to the second word, the second word having a same number of bits as the expected word at the second address.

12. The device of claim 7, further comprising:
a delay unit which, in operation, delays the second word to arrive at the checker at substantially the same time as the expected word at the second address.

13. The device of claim 7 wherein the checker includes:
a comparator which, in operation, compares the expected word at the second address and the second word;
a bit error counter which, in operation, counts a number of bit differences, if any, between the expected word at the second address and the second word; and
a word counter which, in operation, increments a word count in response to the expected word at the second address and the second word being received.

14. The device of claim 7 wherein the input receives bits of the test data in parallel.

15. A device, comprising:
a memory having a content addressable memory (CAM) mode and a standard memory mode, the memory stores expected words at respective address locations, the memory, while in the CAM mode, is configured to receive first and second test words, and determine a first address of an expected word that matches the first test word;
a controller configured to switch the memory from the CAM mode to the standard memory mode in response to the first address being received by the controller, and determine a second address, the second address being set to the first address or incremented from a current address to a subsequent address, the memory, while in the standard memory mode, is configured to receive the second address and output an expected word stored in the CAM at the second address; and a checker configured to receive the expected word at the second address, and determine if there any differences between the second test word and the expected word at the second address.

16. The device of claim 15 wherein the memory, while in the CAM mode, is configured to provide a hit signal to the controller in response to the first address being determined.

17. The device of claim 16 wherein the controller switches the memory from the CAM mode to the standard memory mode in response to the hit signal being received by the controller.

18. The device of claim 15 wherein the memory, while in the CAM mode, is configured to receive an input data and return an address of data stored in the memory that matches the input data, and the memory, while in the standard memory mode, is configured to receive an input address and return data stored in the memory at the input address.

* * * * *